United States Patent
Markle et al.

(10) Patent No.: US 6,794,299 B1
(45) Date of Patent: Sep. 21, 2004

(54) VARIOUS METHODS OF CONTROLLING CONFORMAL FILM DEPOSITION PROCESSES, AND A SYSTEM FOR ACCOMPLISHING SAME

(75) Inventors: Richard J. Markle, Austin, TX (US); David Bennett, Austin, TX (US)

(73) Assignee: Advanced Micro Devices Inc., Austin, TX (US)

( * ) Notice: Subject to any disclaimer, the term of this patent is extended or adjusted under 35 U.S.C. 154(b) by 0 days.

(21) Appl. No.: 10/161,312

(22) Filed: Jun. 3, 2002

(51) Int. Cl.$^7$ .............................................. H01L 21/302
(52) U.S. Cl. ...................................................... 438/710
(58) Field of Search ........................ 438/14, 681, 758, 438/710, 714; 356/603, 604

(56) References Cited

U.S. PATENT DOCUMENTS

| | | | |
|---|---|---|---|
| 6,380,080 B2 * | 4/2002 | Visokay | 438/681 |
| 6,403,491 B1 * | 6/2002 | Liu | 438/710 |
| 6,433,878 B1 * | 8/2002 | Niu | 356/603 |

* cited by examiner

Primary Examiner—John F. Niebling
Assistant Examiner—Andre C Stevenson
(74) Attorney, Agent, or Firm—Williams, Morgan & Amerson

(57) ABSTRACT

Various methods of controlling conformal film deposition processes, and a system for accomplishing same are disclosed. In one embodiment, the method comprises forming a plurality of features above a semiconducting substrate, determining at least one of a critical dimension and a cross-sectional profile of at least one of the plurality of features, determining a thickness for a layer of material to be conformally deposited around the plurality of features based upon at least one of the determined critical dimension and cross-sectional profile and depositing the layer of material around the plurality of features to the determined thickness. In some embodiments, the method further comprises conformally depositing a first layer of material above a plurality of features formed above a semiconducting substrate, measuring a thickness of the first layer of material, determining a thickness of a second layer of material to be conformally deposited around a plurality of features formed above a subsequently processed substrate based upon the measured thickness of the first layer, and conformally depositing the second layer of material to the determined thickness around the plurality of features on the subsequently processed substrate.

29 Claims, 7 Drawing Sheets

VARIOUS METHODS OF CONTROLLING CONFORMAL FILM DEPOSITION PROCESSES, AND A SYSTEM FOR ACCOMPLISHING SAME

BACKGROUND OF THE INVENTION

1. Field of the Invention

This invention relates generally to semiconductor fabrication technology, and, more particularly, to various methods of controlling conformal film deposition processes, and a system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

Typically, integrated circuit devices are comprised of hundreds or millions of transistors formed above a semiconducting substrate. By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown). Additionally, although not depicted in FIG. 1, a typical integrated circuit device is comprised of a plurality of conductive interconnections, such as conductive lines and conductive contacts or vias, positioned in multiple layers of insulating material formed above the substrate 11.

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

During the course of manufacturing integrated circuit devices, various conformal films or process layers are deposited above various features that have previously been formed on the wafer 11. For example, in the case where a plurality of gate electrode features have been formed, a layer of insulating material, e.g., silicon dioxide, silicon oxynitride, silicon nitride, etc., may be conformally deposited above and around the gate electrode features as part of the process of forming sidewall spacers 20 adjacent the gate electrode structures 14. Ideally, the conformally deposited layer of material will uniformly cover the top surface 14A and sidewall surfaces 14B of the gate electrode structures 14. Moreover, such conformally deposited layers or films should avoid excessive thickness variations and not lead to the formation of voids in the completed structure. It should be understood that, by use of the term conformal to describe the deposited layer, it is only intended to mean that the layer is deposited so as to cover substantially all of the surfaces of the features. Such a conformal layer may exhibit undesirable thickness variations, voids, non-uniformities, or other types of defects.

As another example, in the situation where a plurality of openings or trenches are formed in a process layer or substrate, one or more layers of materials may be conformally deposited in these trench or opening type features. For example, in the case where conductive interconnections comprised of copper are formed on an integrated circuit device, the process flow may involve the conformal deposition of a relatively thin barrier metal layer, e.g., tantalum, and a copper seed layer in an opening formed in a layer of insulating material. Layers of material may also be conformally deposited in trenches formed in the semiconducting substrate.

Unfortunately, in some cases, the conformally deposited layer of material does not exhibit some of the desirable characteristics outlined above. For example, a layer of silicon dioxide formed above a plurality of gate electrode structures 14 may exhibit poor coverage of the sidewalls 14B of the gate electrodes 14. Alternatively, the thickness of the layer of silicon dioxide may be much less above the top surface 14A of the gate electrode 14 as compared to the thickness of the layer of silicon dioxide on the sidewalls 14B of the gate electrode 14 and/or between adjacent gate electrode structures 14. Conformally deposited films or layers in openings or trench type features, e.g., a barrier metal layer, may also exhibit poor sidewall coverage, excessive variations and/or non-uniformities in the thickness of the deposited layer on the sidewalls and bottom of the opening, and, in a more severe example, tend to "pinch-off" the openings near the top of the opening, thereby tending to create an undesirable void in the opening or excessive interconnect resistance, etc.

Such problems encountered in accurately forming conformally deposited films or layers may lead to problems with device manufacturing and/or performance. For example, inability to control the thickness and/or sidewall coverage of a conformally deposited layer or film may lead to problems in controlling the thickness and/or coverage of sidewall spacers 20 formed adjacent a gate electrode structure 14. In turn, this may adversely impact device performance, at least to some degree, as various implant processes, i.e., a source/drain implant process, may be performed after the sidewall spacers 20 are formed. If the sidewall spacers 20 are not as thick as intended by the product design, due to poor thickness control and/or poor sidewall coverage, then the source/drain implant may be located at a position that is different than that anticipated in the design of the product. As another example, if a conformally deposited barrier metal layer and/or copper seed layer exhibits poor thickness control and/or excessive thickness variations, the resulting conductive interconnection may not exhibit the desired electrical characteristics, e.g., voids may be formed in the conductive interconnection.

There may be a variety of causes for the problems encountered in forming conformally deposited films above a plurality of features, e.g., gate electrodes, openings in insulating layers, etc. For example, there may be problems with the process recipes used in forming such layers. Additionally, variations in the critical dimensions and/or profile of the various features from those anticipated in the product design may also cause one or more of the types of problems described above.

The present invention is directed to a method and system that may solve, or at least reduce, some or all of the aforementioned problems.

SUMMARY OF THE INVENTION

The present invention is generally directed to various methods of controlling conformal film deposition processes, and a system for accomplishing same. In one illustrative embodiment, the method comprises forming a plurality of features above a semiconducting substrate, determining at least one of a critical dimension and a cross-sectional profile of at least one of the plurality of features, determining a thickness for a layer of material to be conformally deposited around the plurality of features based upon at least one of the determined critical dimension and cross-sectional profile and depositing the layer of material around the plurality of features to the determined thickness. In further embodiments, the method comprises measuring a combination of the deposited layer of material and the plurality of features using a scatterometry tool to measure a manufactured thickness of the deposited layer of material, determining a thickness of a second layer of material to be deposited around a plurality of features formed above a subsequently processed substrate based upon the measured manufactured thickness of the deposited layer of material, and depositing the second layer of material around the plurality of features on the subsequently processed substrate, the deposited second layer being deposited to the determined thickness.

In another illustrative embodiment, the method comprises conformally depositing a first layer of material around a plurality of features formed above a semiconducting substrate, measuring a thickness of the first layer of material, determining a thickness of a second layer of material to be conformally deposited around a plurality of features formed above a subsequently processed substrate based upon the measured thickness of the first layer, and conformally depositing the second layer of material to the determined thickness around the plurality of features on the subsequently processed substrate.

In yet another illustrative embodiment, the method comprises forming a plurality of features above a semiconducting substrate, measuring at least one of a critical dimension and a profile of the plurality of features using a scatterometry tool, determining a thickness of a layer of material to be conformally deposited around the plurality of features based upon the measured at least one of the critical dimension and the profile, and conformally depositing the layer of material to the determined thickness around the plurality of features.

BRIEF DESCRIPTION OF THE DRAWINGS

The invention may be understood by reference to the following description taken in conjunction with the accompanying drawings, in which like reference numerals identify like elements, and in which.

Figure 1:
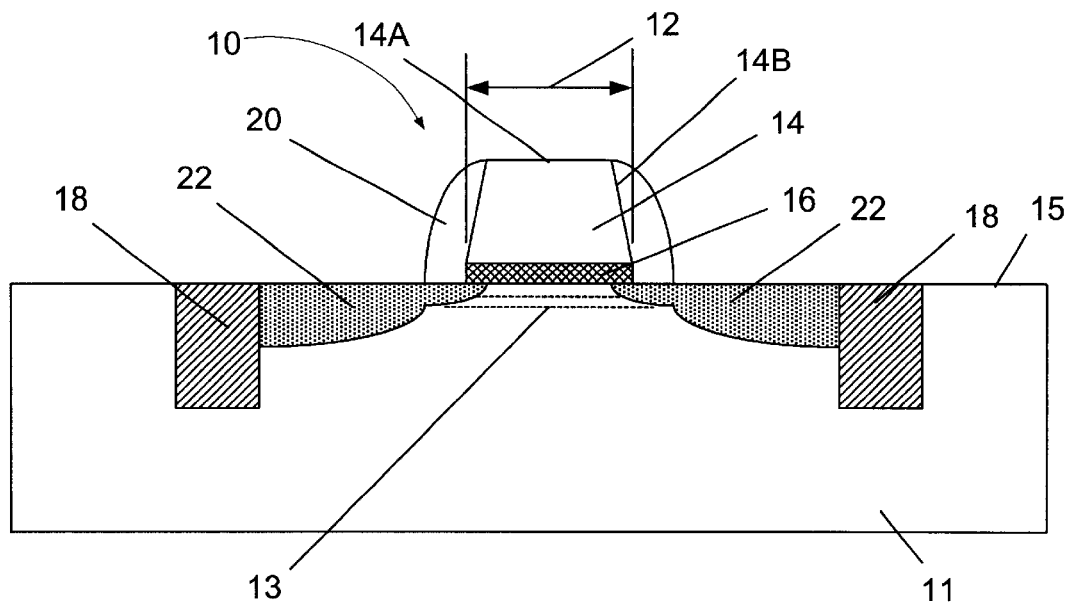
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to various methods of controlling conformal film deposition processes, and a system for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Figure 2A:
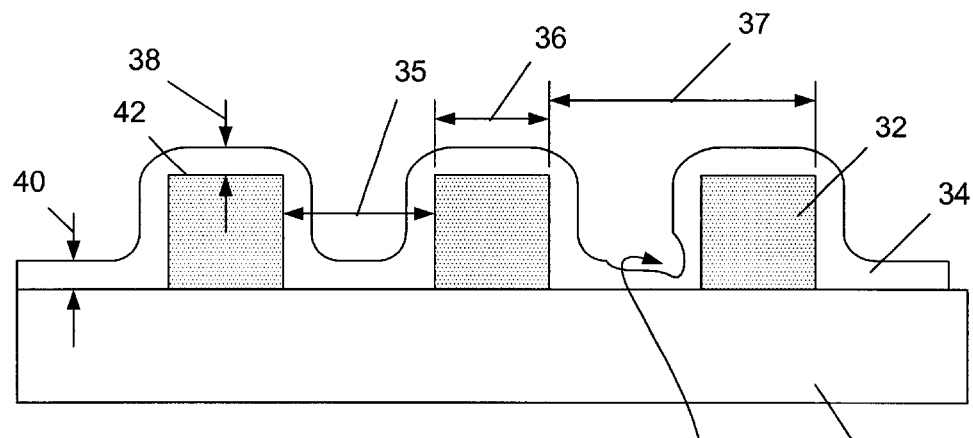
FIGS. 2A–2C are cross-sectional views depicting illustrative critical dimensions and profiles of various features formed above a structure.

As shown in FIG. 2A, a plurality of features 32 are formed above a structure 30. The features 32 have a critical dimension 36, a pitch 37 and a spacer 35. Also depicted in FIG. 2A is a conformally deposited layer of material 34 having a nominal thickness 40. The layer 34 also has a thickness 38 above a top surface 42 of the features 32. In some cases, the thickness 38 may be different than that of the thickness 40, i.e., the thickness 38 may be less than or greater than the thickness 40. The thickness of the layer of material 34 between the features 32 may also vary from the nominal thickness 40. The layer of material 34 may also exhibit non-uniformities 35A, such as those depicted in the attached drawings.

The structure 30 is intended to be representative in nature. That is, the structure 30 is representative of any structure or process layer that may have the plurality of features 32 formed thereabove. For example, the structure 30 may be a semiconducting substrate or a layer of insulating material, e.g., silicon dioxide, BPSG, etc. Similarly, the features 32 are also illustrative in nature, in that they are intended to be representative of any type of feature that may be formed above the structure 30. For example, the features 32 may be gate electrode structures formed above a semiconducting substrate. Alternatively, the features 32 may be a plurality of conductive lines formed above a layer of insulating material. As will be recognized by those skilled in the art after a complete reading of the present application, the present invention is not limited to any particular type of feature 32. Thus, the particular type of features 32 formed, and their locations within an integrated circuit device, should not be considered a limitation of the present invention unless such limitations are expressly set forth in the appended claims. Moreover, as will be described later, the present invention is not limited to the formation of line-type features, such as those depicted in FIG. 2A. That is, as explained more fully below, the present invention may be employed in situations where the features 32 are openings or trench-type features.

The layer of material 34 may be comprised of a variety of different materials, depending on the particular application. For example, the layer of material 34 may be comprised of a variety of insulating materials or conductive materials, e.g., copper, aluminum, tantalum, silicon dioxide, a metal, a metal alloy, a metal silicate, a metal oxide, a metal nitride, etc., depending upon its intended use. Moreover, the thickness 40 of the layer of material 34 may vary depending upon the particular application, e.g., it may range from approximately 30–110 nm (300–1100 Å). Lastly, the layer of material 34 may be formed by a variety of processes, e.g., chemical vapor deposition ("CVD"), plasma enhanced chemical vapor deposition ("PECVD"), physical vapor deposition ("PVD"), atomic layer deposition ("ALD"), low pressure chemical vapor deposition ("LPCVD"), spin-on glass ("SOG"), atmospheric pressure CVD, spin-coating techniques, etc. Thus, the particular material used for the layer of material 34, and its nominal thickness 40 should not be considered a limitation of the present invention unless such limitations are expressly set forth in the appended claims.

In general, the present invention is directed to various methods of controlling conformal deposition processes based upon the critical dimension 36 and/or profile of the features 32. That is, in one illustrative embodiment, the critical dimension 36 and/or cross-sectional profile of one or more of the features 32 is determined, and that information is used to control one or more parameters of a deposition process used to conformally deposit the layer of material 34 around the plurality of features 32. The features 32 may be line-type features or opening-type features.

Figure 2B:
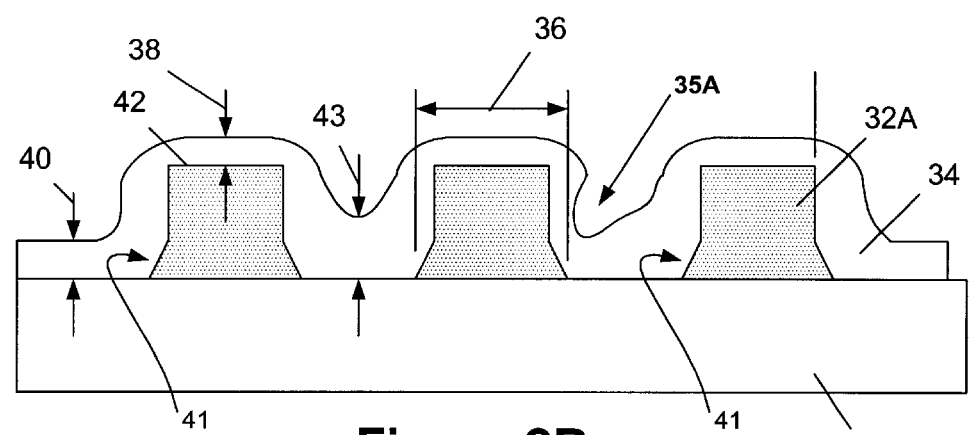
Figure 2C:
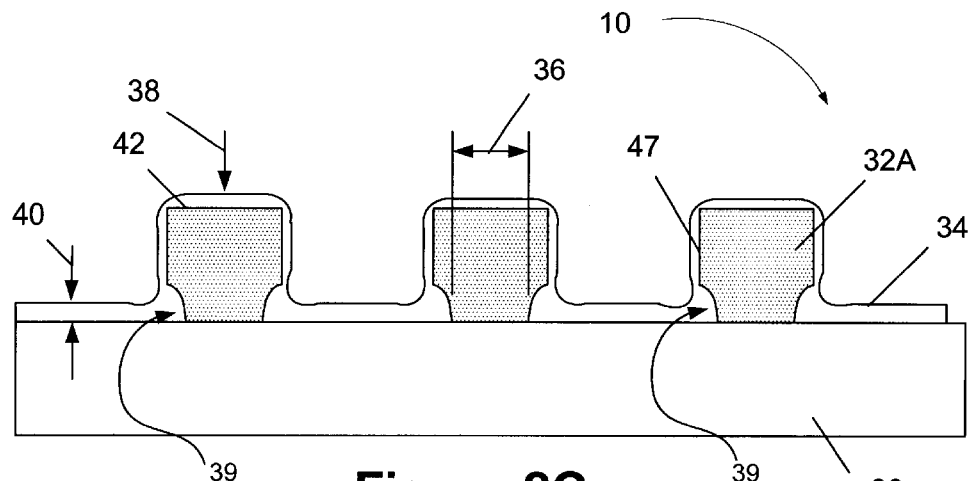

By way of example only, the present invention will now be described in the context where the features 32 are gate electrode structures. As shown in FIGS. 2B–2C, a plurality of gate electrode structures 32A are formed above the structure layer 30. In FIG. 2B, the gate electrode structures 32A exhibit footing or flaring 41 near the base of the gate electrode structures 32A. Such flaring or footing 41 may be caused by a variety of factors, e.g., defective etching equipment and/or poor control of the etching processes used in etching the gate electrodes, poor control of etch endpoint detection equipment and/or poor control of such processes, variations in the thickness of the original layer of material (not shown) from which the gate electrode structures 32A are patterned, etc.

Irrespective of the cause of such flaring 41 and/or other non-uniformities, it may cause undesirable variations in the thickness and/or degree of coverage of the conformal layer of material 34. Moreover, such variations in feature profile and/or critical dimension may lead to problems with the deposited layer, such as a reduction in desirable barrier properties (for barrier layers), delamination, etc. For example, due to the flaring characteristics of the gate electrode structures 32A, the thickness 43 of the layer of material 34 between the gate electrode structure 32A may be greater than desired or anticipated. As a result, subsequent processes and/or features may be adversely impacted. For example, with the unexpected additional thickness 43 of the layer of material 34 between the gate electrode structures 32A, a standard etch process recipe performed on the layer of material 34 based upon an anticipated or expected thickness of the layer of material 34 may result in an incomplete etch of the layer of material 34, which may result in failure to properly form sidewall spacers adjacent the gate electrode structures 32A to the desired dimensions and shape. Even if the etch process used to form the sidewall spacers is an endpoint process, the additional thickness 43 of the layer of material 34 due to the flaring 41 of the gate electrode structures 32A will increase the duration of the etching processes performed on the layer of material 34, all of which tend to reduce manufacturing efficiencies and reduce product yield.

FIG. 2C depicts the illustrative example where the plurality of gate electrode structures 32A exhibit undercutting 39 of the gate electrode structures 32A near its base. This is sometimes referred to as a reentrant profile. As with flaring, undercutting may be the result of defective etch or endpoint equipment and/or poor control of the etch or endpoint processes. In some cases, the reentrant profile may be by design, i.e., to reduce the gate length of a gate electrode structure to thereby increase the operating speed of the device. For example, one or more of the etching processes used to form the gate electrodes 32A may be more isotropic than desired. This variation in the profile of the gate electrode structures 32A, i.e., undercutting, may also cause variations in the thickness and/or coverage of the conformal layer of material 34. That is, due to the presence of such undercutting 39, the thickness 43 of the layer of material 34 may be thinner than anticipated along the sidewalls 47 of the gate electrode structures 32A. In a more extreme example, the layer of material 34 may not completely cover the sidewalls 47 of the gate electrode structure 32A. Thus, standard etching process recipes performed based upon an assumed or anticipated thickness of the layer of material 34 may be detrimental to the accurate construction of the device.

Although not separately depicted in the drawings, variations in the critical dimension 36 of the gate electrode structures 32A may also result in undesirable variations in the thickness and/or coverage of the conformally deposited layer of material 34. For example, if the critical dimensions 36 of the gate electrode structure 32A are larger than anticipated, then the spacing 35 between the gate electrode structures 32A will decrease relative to the spacing anticipated by the design process. As a result, the thickness 43 of the layer of material between the gate electrode structures 32A and along the sidewalls 47 may tend to be greater or thicker than what would otherwise be anticipated. As a result, the sidewall spacers formed adjacent the gate electrode structures 32A may be thicker than desired, which may ultimately have an adverse impact on device performance, e.g., it may adversely impact the desired location of the source/drain implants. In other cases, e.g., where a conformal layer of material, e.g., a copper seed layer, is deposited into a trench formed in an insulating layer, an unanticipated excessively thick copper seed layer may actually tend to pinch off the opening, thereby tending to create undesirable voids.

Figure 3A:
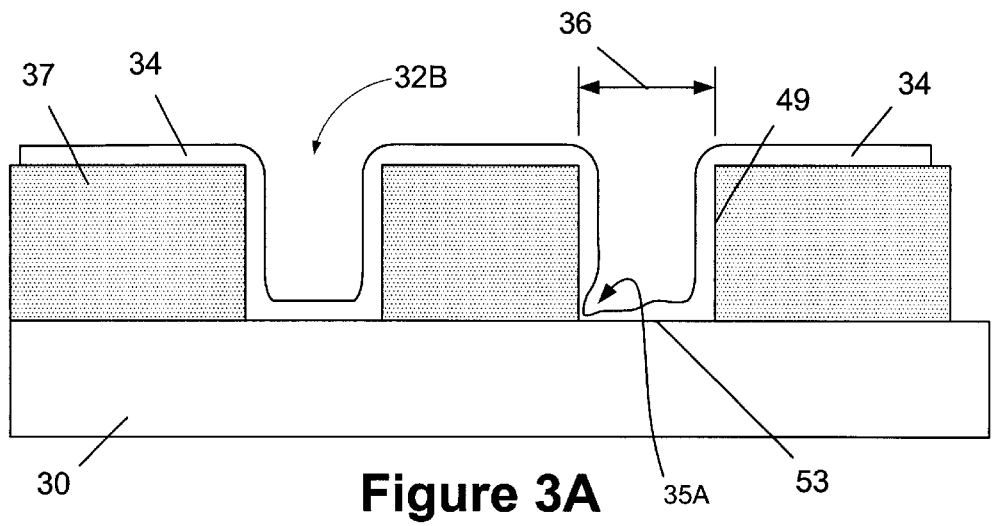
FIGS. 3A–3C are cross-sectional views of various opening-type features formed in a layer of material.
Figure 3B:
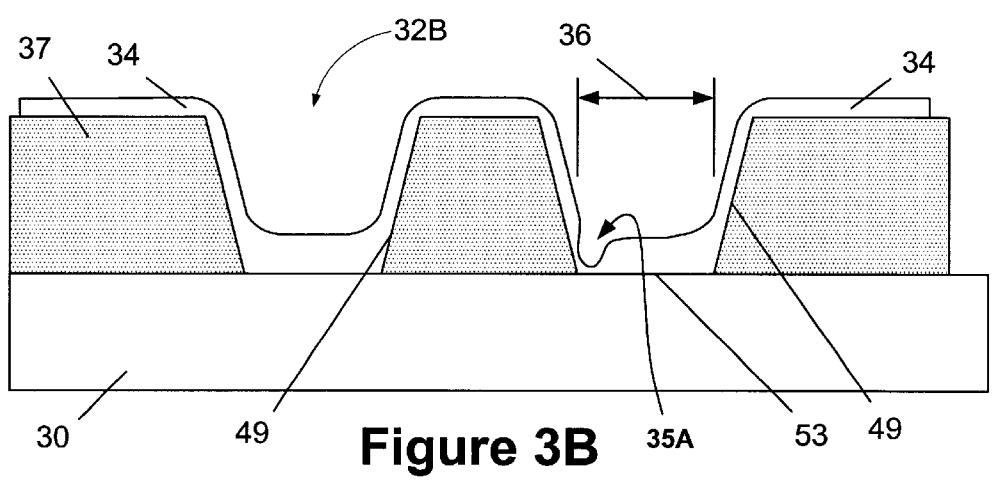
Figure 3C:
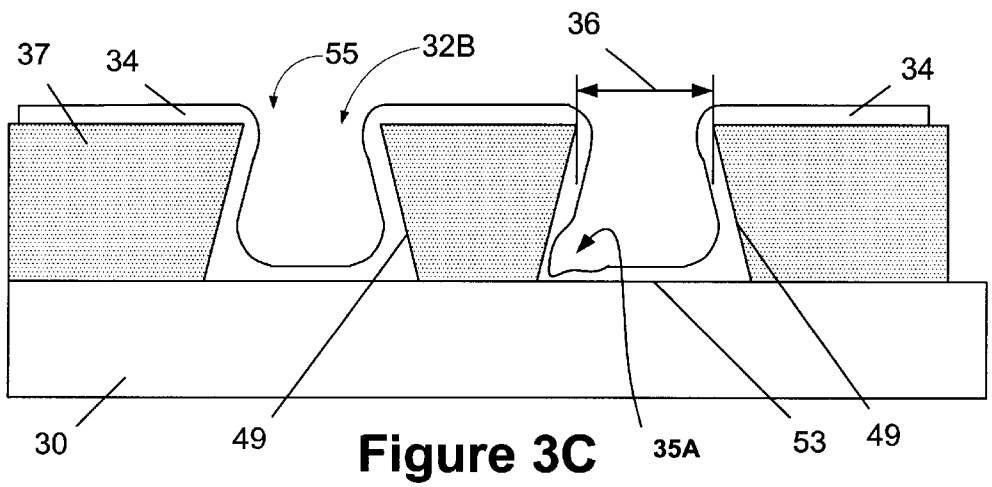

FIGS. 3A–3C depict an illustrative embodiment of the present invention employed in the context of forming a conformal layer of material 34 in an opening or trench-type feature 32B. Such a situation may arise in the context of forming a conductive interconnection in a layer of insulating material or forming a conformal layer of material in a trench formed in a semiconducting substrate.

FIG. 3A depicts a situation in which a plurality of opening-type or trench-type features 32B are formed in a layer of insulating material 37. FIG. 3A depicts an ideal or target situation in which the opening features 32B have relatively vertical sidewalls 49 and a critical dimension 36. FIGS. 3B and 3C depict situations in which the cross-sectional profile of the opening features 32B vary from that of the ideal situation depicted in FIG. 3A. For purposes of clarity and explanation, these variations are somewhat exaggerated in the attached drawings.

In FIG. 3B, the sidewalls 49 of the opening features 32B are not as vertical as those depicted in FIG. 3A. This may be the result of defects in the etching equipment and/or processes used in forming the opening feature 32B or it may be by design. That is, for a variety of reasons, the etching process used to form the opening features 32B depicted in FIG. 3B may not be as anisotropic, i.e., directional, as would be desired. Variations in the profile of the opening features 32B, like that depicted in FIG. 3B, may cause the conformal layer of material 34 that is deposited around the features to be excessively thick at the bottom 53 of the opening feature 32B. Such a result may be problematic in the illustrative example where a conductive interconnection comprised of, for example, copper, will be formed in the opening feature 32B. That is, in the case where the layer of material 34 is a barrier metal layer, e.g., tantalum, the excess thickness of the barrier metal at the bottom 53 of the opening feature 32B may adversely impact the electrical characteristics of the completed conductive interconnection formed therein. For example, the unanticipated additional barrier metal material in effect is substituted for a quantity of copper that would otherwise be formed in the opening feature 32B. As a result, the resistance of the resulting structure may be greater than anticipated. In the case where the layer of material 34 is a copper seed layer, the additional thickness of the copper seed layer may manifest itself as localized areas of increased thickness of a bulk copper layer to be formed in the opening features 32B and above the layer 34 by known electroplating processes. Such thickness variations may also manifest itself as voids. As a result, the chemical mechanical polishing processes that will be performed to remove the excess quantities of bulk copper layer may need to be performed for a longer duration. Additionally, such localized thickness variations in the bulk layer of copper may also result in the chemical mechanical polishing process producing less than desirable results, i.e., the planarity of the resulting surface may be less than desired due to the localized thickness variations in the bulk layer of copper. In general, such variations in the deposited layer may also manifest itself as undesirable changes in the resistivity of the layer, poor barrier properties (for barrier layers), poor diffusion and adhesion, etc.

FIG. 3C depicts the situation wherein the cross-sectional profile of the opening features 32B also varies from the ideal situation depicted in FIG. 3A. In FIG. 3C, the sidewalls 49 of the openings 38B are flared inwardly or reentrant, i.e., under-cut. Again, such a profile may be the result of defects or variations in the etching or endpoint processes and/or equipment used to form the opening features 32B. With the profile depicted in FIG. 3C, the conformal layer of material 34 may be thicker at a corner region 55 of the opening-type feature 32B, and the coverage of the sidewalls 49 and bottom 53 of the opening features 32B may be less than desirable. As a result, the conformal layer of material 34 may not be capable of performing its intended functions and/or subsequent process operations may be adversely impacted. For example, if the layer of material 34 is a barrier metal layer, e.g., tantalum, then the variation in the profile of the opening features 32B, as depicted in FIG. 3C, may result in the situation where the barrier metal layer does not completely cover the bottom 53 and sidewalls 49 of the opening features 32B. In a more extreme example, the profile of the opening feature 32B depicted in FIG. 3C may be such that the layer of material 34 may tend to "pinch-off" or close the entrance of the opening-type features 32B, thereby preventing subsequent filling of the opening-type features 32B or greatly increasing the possibility of forming voids in the structures subsequently formed in the opening-type features 32B.

As with the features 32 depicted in FIGS. 2A–2C, the critical dimension 36 of the opening features 32B depicted in FIGS. 3A–3C may also vary from that of a target or expected value. As a result, some or all of the problems discussed above with respect to the variations in the profile of the opening features 32B may also result.

Figure 4A:
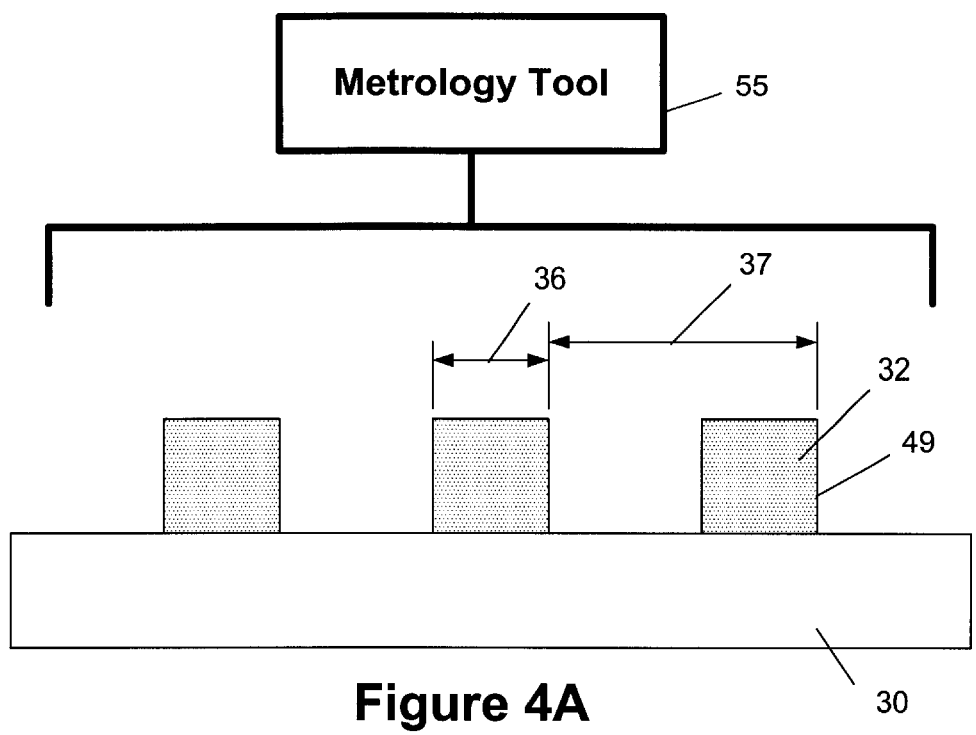
FIGS. 4A–4B depict illustrative embodiments of the present invention wherein a metrology tool is used to measure or determine a critical dimension and/or a profile of one or more features.
Figure 4B:
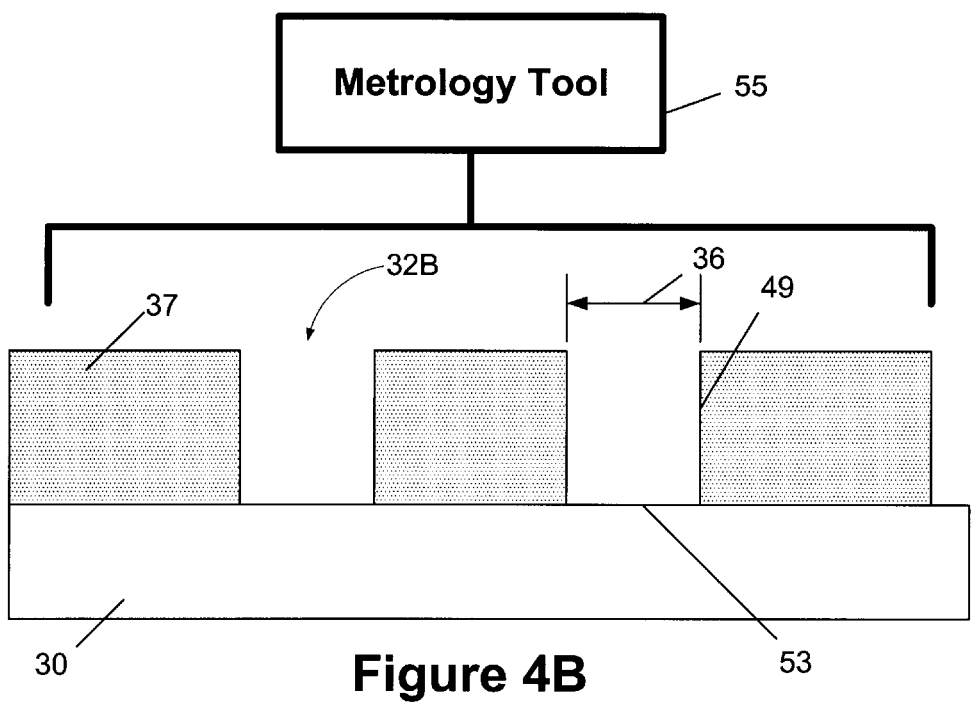

FIGS. 4A and 4B schematically depict one illustrative embodiment of the present invention. As shown therein, a metrology tool 55 is used to measure a critical dimension 36 and/or cross-sectional profile 49 of one or more of the features 32 depicted therein. FIG. 4A depicts the illustrative example where the features 32 are line-type features, e.g., gate electrodes, conductive metal lines, etc. FIG. 4B schematically depicts the illustrative example where the features 32 are opening-type features, e.g., openings in a layer of insulating material, trenches in a substrate, etc. As will be disclosed more fully below, the metrology tool 55 may be any type of tool useful for measuring or determining the critical dimension 36 and/or profile of the features 32. For example, the metrology tool 55 may be a scanning electrode microscope (SEM) or a scatterometry tool.

Figure 5:
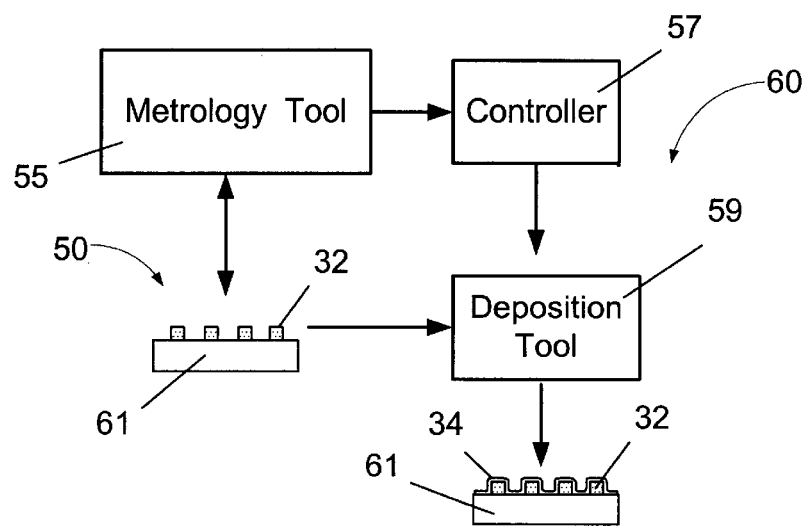
FIG. 5 is a schematic depiction of a system in accordance with one illustrative embodiment of the present invention.

FIG. 5 depicts one illustrative embodiment of a system 60 that may be employed with the present invention. As shown therein, the system 60 is comprised of a metrology tool 55, a controller 57, and a deposition tool 59. Also depicted in FIG. 5 is an illustrative wafer 61 having a plurality of features 32 formed thereabove. As set forth above, the metrology tool 55 may be a scanning electron microscope, a scatterometry tool, or any other type of metrology device or system capable of determining or measuring the critical dimension and/or profile of the features 32. The deposition tool 59 may be any type of tool that may be used to deposit the layer of material 34, e.g., a CVD tool, a PVD tool, an ALD tool, spin-track dispenser, etc.

In general, the metrology tool 55 will be used to determine and/or measure the critical dimension and/or profile of the features 32 and feed that information forward, to the controller 57. The controller 57 may adjust or determine one or more parameters of the deposition process to be performed in the deposition tool 59 to conformally deposit a layer of material 34 around the plurality of features 32. That is, the controller 57 may vary one or more parameters of the deposition process in the deposition tool 59 in an effort to compensate for variations in the layer of material 34 that would occur based upon the variations in the critical dimension 36 and/or cross-sectional profile of the features 32. For example, one or more parameters of the deposition process, such as temperature, duration, pressure, gas flow rates, bias applied to the wafer or target (in the case of a PVD tool), the gap distance between gas inlets/showerheads and the wafer, etc., may be adjusted or modified. That is, in some cases, the thickness of the conformal layer of material 34 may be formed to a thickness that is determined based upon the measured or determined critical dimension 36 and/or profile of the features 32. In one embodiment, the thickness of the layer of material 34 may be increased or decreased, relative to a baseline or target thickness for the layer of material 34 on the assumption that the critical dimension 36 and/or cross-sectional profile of the features 32 were on target with an anticipated critical dimension and/or profile. In another embodiment, the deposition rate of the process performed in the deposition tool 59 may be reduced in situations where the critical dimension 36 and/or profile of the features 32 indicated that such an action is warranted or desired. For example, if the features 32 are opening-type features 32B like those depicted in FIG. 3C, it may be desirable to perform the deposition process in the tool 59 at a very slow rate in an effort to achieve adequate thickness and coverage of the sidewalls 49 of the opening feature 32B.

Figure 6A:
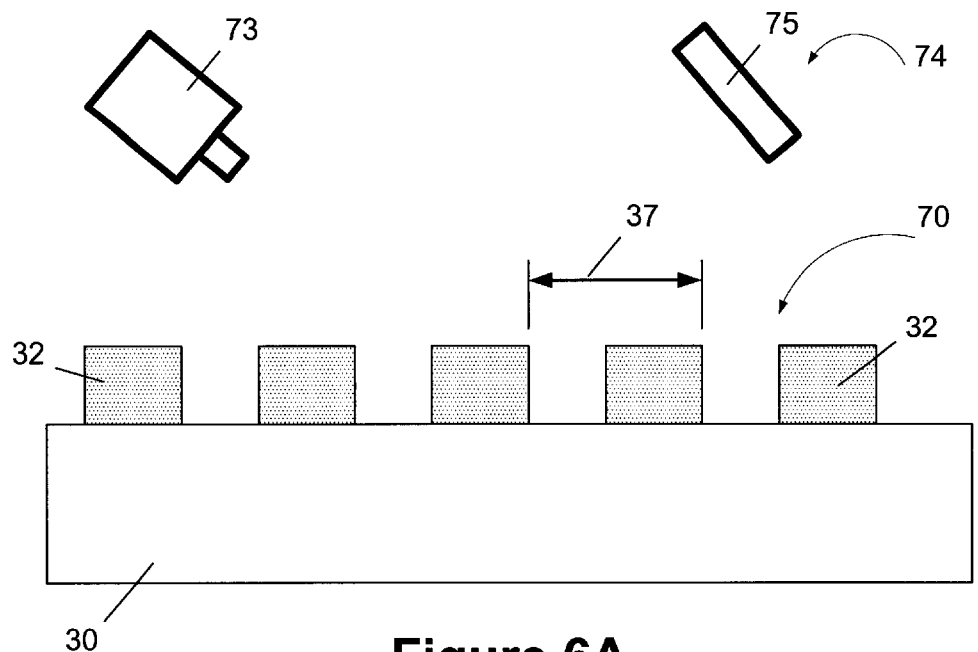
FIGS. 6A–6B depict an illustrative grating structure comprised of a plurality of features and a scatterometry tool illuminating such structures in accordance with one aspect of the present invention.
Figure 6B:
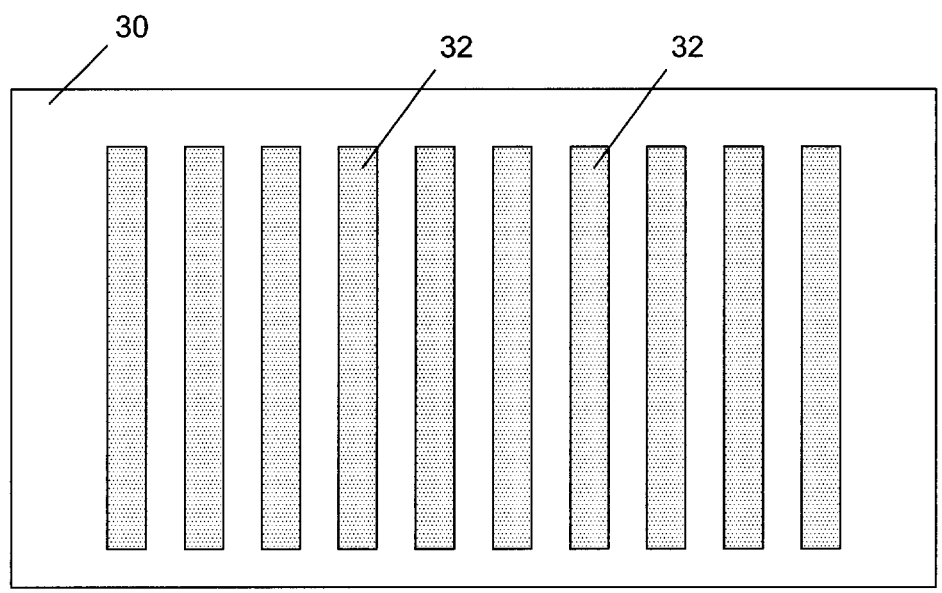

In one embodiment, as shown in FIGS. 6A–6B, the present invention involves the formation of a plurality of features 32 to define a grating structure 70. The features 32 comprising the grating structure 70 may have a pitch 37 that varies from approximately 400–1000 nm. The grating structure 70 may be formed in the scribe line of a wafer, and the grating structure 70 may be formed at the same time the features 32 are being formed for production devices formed on the wafer. A plurality of such grating structures 70 may be formed at various locations across a surface of a wafer. Depending upon the type of integrated circuit device under consideration, and/or as a matter of design choice, the grating structure(s) 70 may be comprised of features 32 that can be part of actual production integrated circuit devices. For example, for memory devices, the features 32 comprising the grating structure 70 may be gate electrode structures that are part of the completed memory device. The size, shape and configuration of the grating structure 70 may be varied as a matter of design choice. For example, the grating structure 70 may be formed in an area having approximate dimensions of 100 $\mu$m×120 $\mu$m, and it may be comprised of approximately 500–1500 features (depending upon the selected pitch).

Also depicted in FIG. 6A is an illustrative scatterometry tool 74 comprised of a representative light source 73 and a detector 75. Ultimately, in one embodiment, the grating structure 70 will be measured using scatterometric techniques, and these measurements will be used to determine and/or confirm the profile of the features 32 comprising the grating structure 70. Moreover, the results of the scatterometry measurements may be used to determine, confirm and/or control one or more parameters of a deposition process used to form the conformal layer of material 34 above the features 32 on the measured substrate and/or additional substrates.

A variety of scatterometry tools 74 may be used with the present invention, e.g., so-called 2θ-type systems and lens-type scatterometry tools. The scatterometry tool 74 may use white light, or some other wavelength or combination of wavelengths, depending on the specific implementation. Typically, the scatterometry tool 74 will generate an incident beam that has a wide spectral composition and wherein the intensity of the light changes slowly in comparison to changes in wavelength. The angle of incidence of the light may also vary, depending on the specific implementation. The profile traces generated by the scatterometry tool 74 may be based upon a comparison of light intensity to wavelength (for white light, fixed angle type scatterometry tools) or a comparison of intensity to incident angle (for angle resolved systems that use a single light source).

Figure 7A:
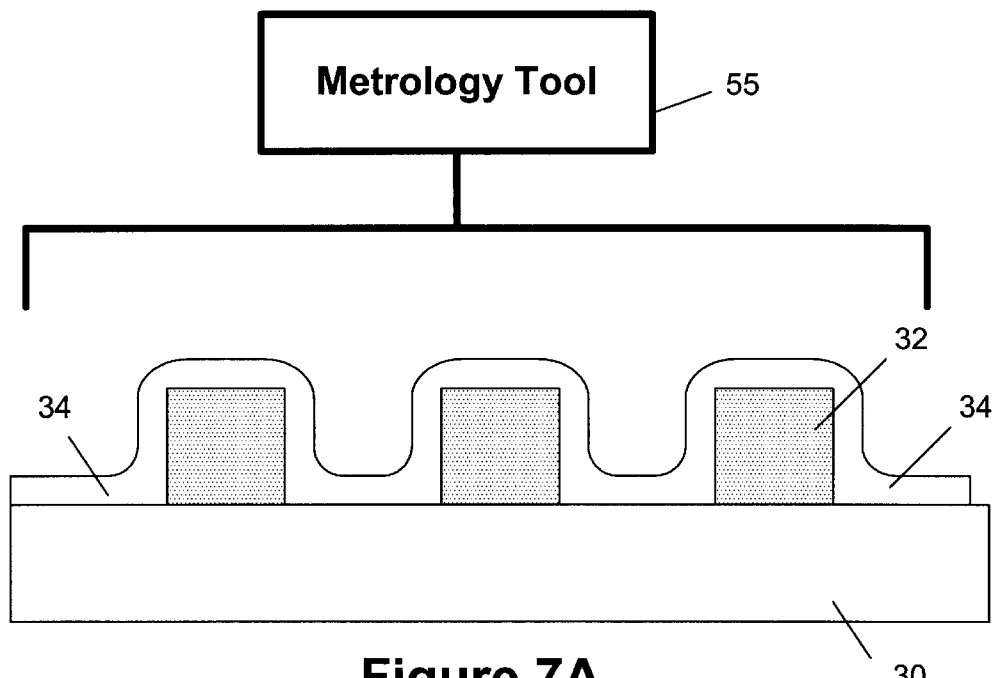
FIGS. 7A–7B depict another illustrative embodiment of the present invention wherein a layer of material is deposited over a plurality of features and a metrology tool is used to measure or determine the thickness of the layer of material.
Figure 7B:
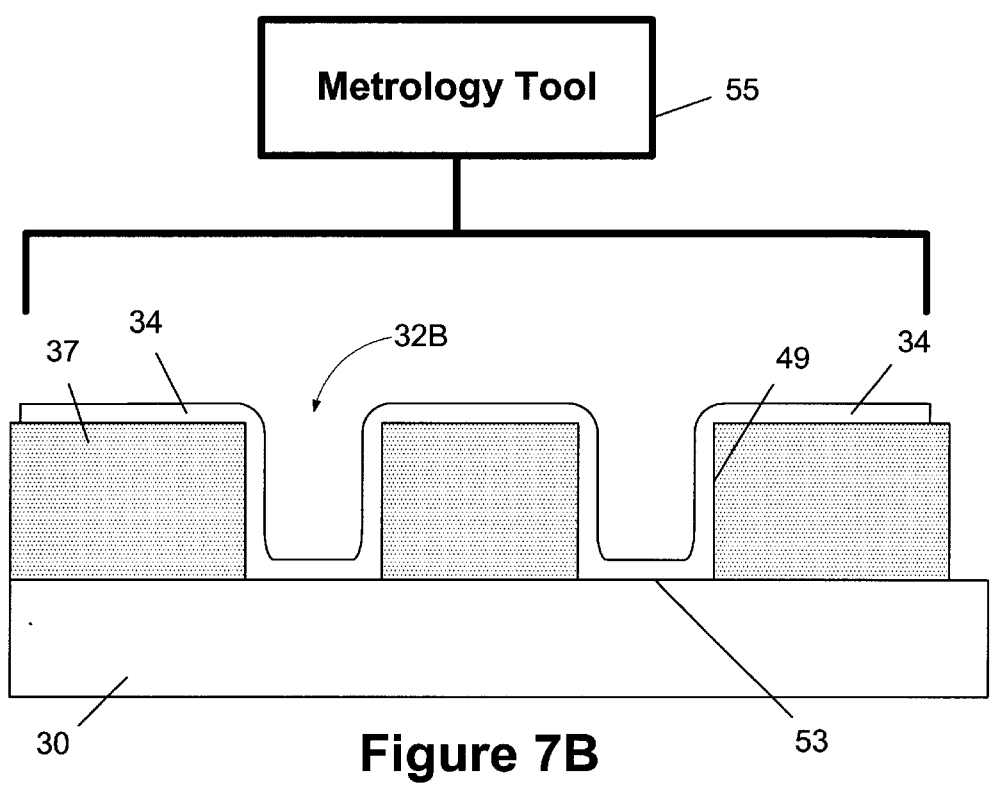
Figure 8:
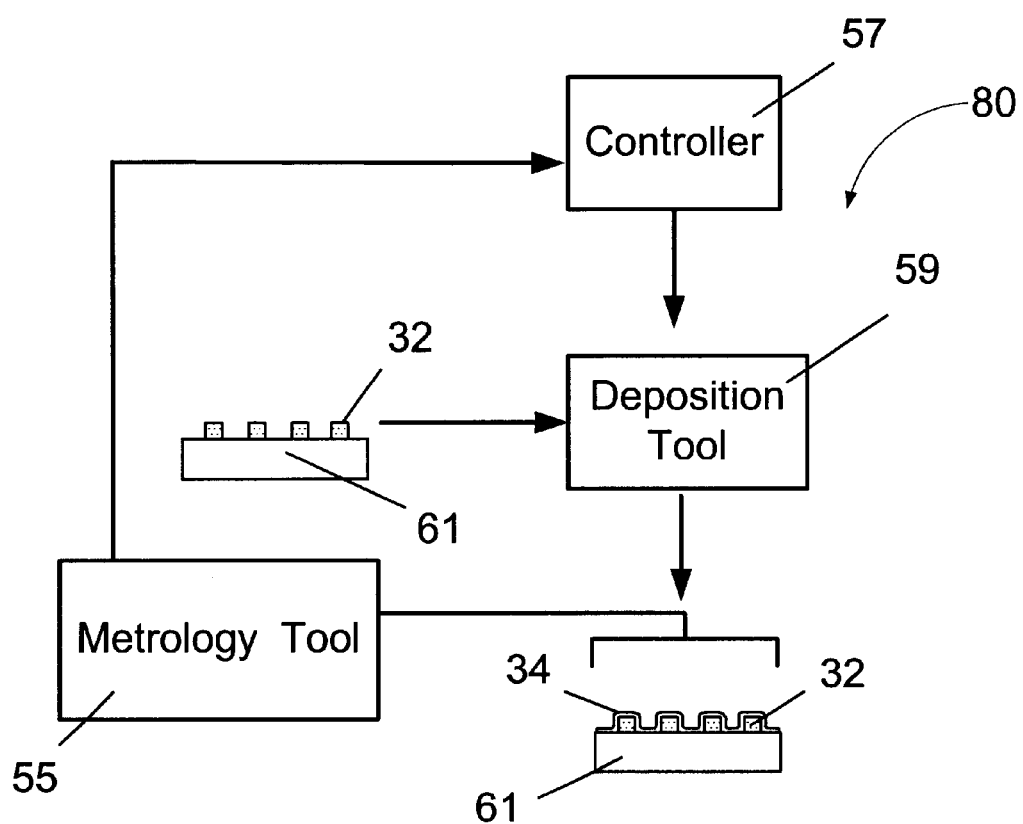
FIG. 8 is a schematic depiction of another illustrative embodiment of a system in accordance with one embodiment of the present invention.

In another illustrative embodiment, as depicted in FIGS. 7A–7B, after the layer of material 34 is formed, the metrology tool 55 may be used to measure the combined layer of material 34 and features 32 to determine the actual thickness of the layer of material 34. In turn, this information may be fed back to the controller 57 to adjust or determine one or more parameters of the deposition process used to form a layer of material 34 above a plurality of features 32 on a subsequently processed wafer. A schematic depiction of such a system 80 is depicted in FIG. 8. Of course, the present invention also encompasses systems incorporating both the feed forward and feed back aspects described herein.

In one illustrative embodiment of the present invention, the critical dimension 36 and/or cross-sectional profile of a plurality of features 32 is determined or measured using an appropriate metrology tool 55, e.g., a scanning electron microscope. Any number of such features 32 may be measured. Moreover, the features 32 on more than one wafer in a lot may be measured. However, every lot of wafers need not be subjected to such measurements. Once the metrology data is collected, it may be averaged or otherwise statistically manipulated to arrive at what is deemed to be the critical dimension 36. and/or cross-sectional profile of the sampled features 32, or a range thereof. Once obtained, this metrology data may be provided to the controller 57 for use in determining or adjusting at least one parameter of the deposition process performed in the deposition tool 59 to form the layer of material 34 above the plurality of features.

As set forth above, the present invention may also be used in situations where the metrology tool 55 is used to measure or determine the cross-sectional profile of the features 32. For example, through use of scatterometry, a characteristic signature or profile trace, associated with a particular profile of the features 32, may be calculated (using Maxwell's equations) for a vast variety, if not all, possible combinations of profiles readily anticipated by the design process. These profile traces may be stored in a library or generated real-time from mathematical models. The scatterometry profile trace may be based on a variety of characteristics of the features 32. For example, in the case where the features 32 are gate electrode structures, the optical characteristic trace may be based upon a ratio of the width of the gate electrode at a top surface as compared to the width of the gate electrode at a depth that equates to approximately 90% of the thickness of the gate electrode structure. Other characteristics such as the total amount of undercutting, the total amount of footing, or the area of the gate electrode structures may also be used as the basis for the optical characteristic traces for the gate electrode profiles.

Variations in one or more of the characteristics of the profile of the features 32 will cause a significant change in the diffraction characteristics of the incident light from the light source 73 of the scatterometry tool 74. Thus, using Maxwell's equations, a unique profile trace may be established for each unique feature profile anticipated by the design process. A library of profile traces corresponding to each anticipated feature profile may be calculated and stored in a library or determined and used on a real-time or near-real-time basis. Through this technique, each trace in the library or generated real-time using a mathematical model represents a grating structure 70 comprised of features having a known profile. If desired, the profiles of the features 32 for each of the traces may be confirmed using a variety of destructive metrology tests or various test wafers. For example, the actual profile of the feature 32 represented by a trace may be confirmed by cross-sectioning the feature 32 and observing and measuring characteristics of the profile of the feature 32 using a scanning electron microscope. Obviously, where a library of traces is created, the number of profiles used to create the library may vary as a matter of design choice. Moreover, the larger the number of profiles, the larger will be the library containing the profiles. The scatterometry tools that generate real-time or near-real-time profile traces may create and store a relatively small library of such traces in memory within the scatterometry tool.

In one illustrative embodiment, the present invention may be employed to correlate or match a measured or generated profile trace of a grating structure 70 comprised of a plurality of features 32 having an unknown profile to one or more other profiles, each of which corresponds to a grating structure 70 comprised of features 32 having a particular known profile. That is, in one embodiment, the scatterometry tool 74 is used to measure and generate a profile trace for a given grating structure 70 comprised of a plurality of features 32 of an unknown profile. The scatterometry tool 74 may measure one or more grating structures 70 on a given wafer in a lot or even generate a profile trace for each grating structure 70 in the lot, depending on the specific implementation. Moreover, the profile traces from a sample of the grating structures 70 may be averaged or otherwise statistically analyzed. The scatterometry tool 74 (or some other controller resident within the manufacturing plant, e.g., controller 57) compares the measured profile trace (i.e., individual or averaged) to one or more other profile traces (from a library or generated real-time) with known profiles to correlate or approximately match the current measured profile trace with the other trace, i.e., a trace in the library or a trace generated real-time. When a match is confirmed, the scatterometry tool 74 (or other controller) may then provide data as to the profile of the feature 32 in the measured grating structure 70. For example, the scatterometry tool 74 may output data, based upon the matched profile trace from the library or from a real-time source, indicating that the features 32 in the measured grating structure 70 have a width-to-depth ratio of a certain value. A variety of data output criteria and format are possible.

Based upon these comparisons, the previously unknown profile of the features 32 comprising the measured grating structure 70 may be determined. Additionally, based upon the critical dimension and/or determined profile of the features 32, the controller 57, if needed, may adjust one or more parameters of the deposition process to be performed in the deposition tool 59 to form the conformal layer of material 34 above the plurality of features. For example, one or more parameters, such as duration, gas composition, gas flow rates, pressure, temperature, gap between gas showerhead and the wafer surface, etc., may be varied or determined. In the case where a spin-coating process is used, parameters such as spin track rpm, hot plate temperature, etc., may be varied.

The optical measurements of the grating structure 70 may be performed on any desired number of grating structures 70 and wafers. For example, such measurements may be performed on all wafers in one or more lots, or on a representative number of wafers in a given lot, and these results may then be used to determine or vary one or more parameters, e.g., process gases, flow rates, pressure, temperature, duration, spacing between the wafer and showerheads, etc., of the deposition process performed in the deposition tool 59.

A In another illustrative embodiment, as depicted in FIGS. 7A–7B and 8, the present invention may be employed to measure the thickness of the layer of material 34 after it has been formed above the plurality of features 32. This may be accomplished through use of, for example, a scatterometry tool. In one embodiment, using such a metrology tool, a library of traces may be established for all reasonably anticipated combinations of feature profiles and/or critical dimensions and thickness of the layer of material 34. In other cases, the scatterometry tool may use mathematical models to generate profile traces on a real-time or near-real-time basis. As before, the scatterometry tool may be used to generate an optical characteristic trace for the combination of the layer of material 34 formed above the plurality of features 32. The measured trace is then compared to one or more traces stored in a library or generated on a real-time basis, each of which corresponds to a layer of material 34 of a known thickness. Once a match is established between the measured trace and the other trace, the thickness of the layer of material 34 may be determined. Thereafter, this metrology data may be used by the controller 57 to adjust one or more parameters of the deposition process to be performed in the deposition tool 59 to form a layer of material 34 on a subsequently processed wafer.

Control equations may be employed to adjust the operating recipe of the deposition tool 59 in situations where the methods described herein indicate that an adjustment is warranted. The control equations may be developed empirically using commonly known linear or non-linear techniques. The controller 57 may automatically control the operating recipes of the deposition tool 59 used to perform one or more etching processes on the subsequently processed wafers. Through use of the present invention, the extent and magnitude of variations in the thickness of the layer of material 34 may be reduced.

In the illustrated embodiments, the controller 57 is a computer programmed with software to implement the functions described herein. Moreover, the functions described for the controller 57 may be performed by one or more controllers spread through the system. For example, the controller 57 may be a fab level controller that is used to control processing operations throughout all or a portion of a semiconductor manufacturing facility. Alternatively, the controller 57 may be a lower level computer that controls only portions or cells of the manufacturing facility. Moreover, the controller 57 may be a stand-alone device, or it may reside on the deposition tool 59. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 57, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699 —Provisional Specification for CIM Framework Domain Architecture) and APC (SEMI E93-0999—Provisional Specification for CIM Framework Advanced Process Control Component) specifications are publicly available from SEMI.

The present invention is generally directed to various methods of controlling conformal film deposition processes, and a system for accomplishing same. In one illustrative embodiment, the method comprises forming a plurality of features above a semiconducting substrate, determining at least one of a critical dimension and a cross-sectional profile of at least one of the plurality of features, determining a thickness for a layer of material to be conformally deposited around the plurality of features based upon at least one of the determined critical dimension and cross-sectional profile and depositing the layer of material around the plurality of features to the determined thickness. In further embodiments, the method comprises measuring a combination of the deposited layer of material and the plurality of features using a scatterometry tool to measure a manufactured thickness of the deposited layer of material, determining a thickness of a second layer of material to be deposited around a plurality of features formed above a subsequently processed substrate based upon the measured manufactured thickness of the deposited layer of material, and depositing the second layer of material around the plurality of features on the subsequently processed substrate, the deposited second layer being deposited to the determined thickness.

In another illustrative embodiment, the method comprises conformally depositing a first layer of material around a plurality of features formed above a semiconducting substrate, measuring a thickness of the first layer of material, determining a thickness of a second layer of material to be conformally deposited around a plurality of features formed above a subsequently processed substrate based upon the measured thickness of the first layer, and conformally depositing the second layer of material to the determined thickness around the plurality of features on the subsequently processed substrate.

In yet another illustrative embodiment, the method comprises forming a plurality of features above a semiconducting substrate, measuring at least one of a critical dimension and a profile of the plurality of features using a scatterometry tool, determining a thickness of a layer of material to be conformally deposited around the plurality of features based upon the measured at least one of the critical dimension and the profile, and conformally depositing the layer of material to the determined thickness around the plurality of features.

The present invention is also directed to a system for accomplishing the illustrative methods described herein. In one embodiment, the system is comprised of a controller, a metrology tool and a deposition tool. In some embodiments, the metrology tool is used to determine or measure the critical dimension and/or profile of one or more features formed above a substrate. Thereafter, in one embodiment, the controller determines a thickness of a layer of material to be conformally deposited around the plurality of features based upon the determined critical dimension and/or profile of the features. Then, the deposition tool is used to deposit the layer of material to the determined thickness. In another embodiment, the metrology tool is used to measure the thickness of a layer of material after it is conformally deposited around the plurality of features. Thereafter, the metrology data is provided to the controller which then determines the thickness of a layer of material to be conformally deposited around a plurality of features on a subsequently processed substrate.

Through use of the present invention, better process control may be achieved in modern integrated circuit manufacturing facilities. Additionally, the present invention may enable more precise formation of conformally deposited films or layers employed in integrated circuit devices, thereby improving device performance and increasing production yields.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming a plurality of features above a semiconducting substrate;
   determining at least one of a critical dimension and a cross-sectional profile of at least one of said plurality of features;
   determining a thickness for a layer of material to be conformally deposited around said plurality of features based upon said at least one of said determined critical dimension and said cross-sectional profile; and
   depositing said layer of material around said plurality of features to said determined thickness.

2. The method of claim 1, wherein forming a plurality of features above a semiconducting substrate comprises forming a plurality of line-type features above a semiconducting substrate.

3. The method of claim 1, wherein forming a plurality of features above a semiconducting substrate comprises forming a plurality of opening-type features above a semiconducting substrate.

4. The method of claim 1, wherein determining at least one of a critical dimension and a cross-sectional profile of at least one of said plurality of features comprises determining at least one of a critical dimension and a cross-sectional profile of at least one of said plurality of features through use of at least one of a scanning electron microscope and a scatterometry tool.

5. The method of claim 1, wherein depositing said layer of material around said plurality of features to said determined thickness comprises depositing said layer of material around said plurality of features to said determined thickness, said layer of material being deposited by at least one of a chemical vapor deposition process, a physical vapor deposition process, an atomic layer deposition process, a low pressure chemical vapor deposition process, an atmospheric pressure chemical vapor deposition process, and a spin-coating process.

6. The method of claim 1, wherein depositing said layer of material around said plurality of features to said determined thickness comprises depositing said layer of material around said plurality of features to said determined thickness, said layer of material being comprised of at least one of a metal, a metal silicate, a metal oxide, a metal nitride, polysilicon, copper, aluminum, tantalum, silicon dioxide, silicon oxynitride and silicon nitride.

7. The method of claim 1, further comprising:
   measuring a combination of said deposited layer of material and said plurality of features using a scatterometry tool to measure a manufactured thickness of said deposited layer of material;
   determining a thickness of a second layer of material to be deposited around a plurality of features formed above a subsequently processed substrate based upon said measured manufactured thickness of said deposited layer of material; and
   depositing said second layer of material around said plurality of features on said subsequently processed substrate, said deposited second layer being deposited to said determined thickness.

8. A method, comprising:
   forming a plurality of features above a semiconducting substrate;
   determining a cross-sectional profile of at least one of said plurality of features by using a scatterometry tool;
   determining a thickness for a layer of material to be conformally deposited around said plurality of features based upon said cross-sectional profile; and
   depositing said layer of material around said plurality of features to said determined thickness.

9. The method of claim 8, wherein forming a plurality of features above a semiconducting substrate comprises forming a plurality of line-type features above a semiconducting substrate.

10. The method of claim 8, wherein forming a plurality of features above a semiconducting substrate comprises forming a plurality of opening-type features above a semiconducting substrate.

11. The method of claim 8, wherein depositing said layer of material around said plurality of features to said determined thickness comprises depositing said layer of material around said plurality of features to said determined thickness, said layer of material being deposited by at least one of a chemical vapor deposition process, a physical vapor deposition process, and an atomic layer deposition process, a low pressure chemical vapor deposition process, an atmospheric pressure chemical vapor deposition process, and a spin-coating process.

12. The method of claim 8, wherein depositing said layer of material above said plurality of features to said determined thickness comprises depositing said layer of material above said plurality of features to said determined thickness, said layer of material being comprised of at least one of a metal, a metal silicate, a metal oxide, a metal nitride, polysilicon, copper, aluminum, tantalum, silicon dioxide, silicon oxynitride and silicon nitride.

13. The method of claim 8, further comprising:
   measuring a combination of said deposited layer of material and said plurality of features using a scatterometry tool to measure a manufactured thickness of said deposited layer of material;
   determining a thickness of a second layer of material to be deposited around a plurality of features formed above a subsequently processed substrate based upon said measured manufactured thickness of said deposited layer of material; and
   depositing said second layer of material around said plurality of features on said subsequently processed substrate, said deposited second layer being deposited to said determined thickness.

14. A method, comprising:
   conformally depositing a first layer of material around a plurality of features formed above a semiconducting substrate;
   measuring a thickness of said first layer of material;
   determining a thickness of a second layer of material to be conformally deposited around a plurality of features formed above a subsequently processed substrate based upon said measured thickness of said first layer; and
   conformally depositing said second layer of material to said determined thickness around said plurality of features on said subsequently processed substrate.

15. The method of claim 14, wherein conformally depositing a first layer of material around a plurality of features formed above a semiconducting substrate comprises conformally depositing a first layer of material around a plurality of line-type features formed above a semiconducting substrate.

16. The method of claim 14, wherein conformally depositing a first layer of material around a plurality of features formed above a semiconducting substrate comprises conformally depositing a first layer of material around a plurality of opening-type features formed above a semiconducting substrate.

17. The method of claim 14, wherein measuring a thickness of said first layer of material comprises measuring a thickness of said first layer of material using a scatterometry tool.

18. The method of claim 14, wherein measuring a thickness of said first layer of material comprises determining a thickness of said first layer of material by a method that comprises obtaining an optical characteristic trace of the combination of said first layer of material and said plurality of features.

19. The method of claim 14, wherein conformally depositing said second layer of material around said plurality of features to said determined thickness comprises conformally depositing said second layer of material around said plurality of features to said determined thickness, said second layer of material being deposited by at least one of a chemical vapor deposition process, a physical vapor deposition process, and an atomic layer deposition process, a low pressure chemical vapor deposition process, an atmospheric pressure chemical vapor deposition process, and a spin-coating process.

20. The method of claim 14, wherein conformally depositing said second layer of material around said plurality of features to said determined thickness comprises conformally depositing said second layer of material around said plurality of features to said determined thickness, said second layer of material being comprised of at least one of a metal, a metal silicate, a metal oxide, a metal nitride, polysilicon, copper, aluminum, tantalum, silicon dioxide, silicon oxynitride and silicon nitride.

21. A method, comprising:
conformally depositing a first layer of material around a plurality of features formed above a semiconducting substrate;
measuring a thickness of said first layer of material by a method that comprises obtaining an optical characteristic trace of the combination of said first layer and said plurality of features;
determining a thickness of a second layer of material to be conformally deposited above a plurality of features formed above a subsequently processed substrate based upon said measured thickness of said first layer; and
conformally depositing said second layer of material to said determined thickness around said plurality of features on said subsequently processed substrate, said layer of material being deposited by at least one of a chemical vapor deposition process, a physical vapor deposition process, and an atomic layer deposition process, a low pressure chemical vapor deposition process, an atmospheric pressure chemical vapor deposition process, and a spin-coating process.

22. The method of claim 21, wherein conformally depositing a first layer of material around a plurality of features formed above a semiconducting substrate comprises conformally depositing a first layer of material around a plurality of line-type features formed above a semiconducting substrate.

23. The method of claim 21, wherein conformally depositing a first layer of material around a plurality of features formed above a semiconducting substrate comprises conformally depositing a first layer of material around a plurality of opening-type features formed above a semiconducting substrate.

24. The method of claim 21, wherein conformally depositing said second layer of material around said plurality of features to said determined thickness comprises conformally depositing said second layer of material around said plurality of features to said determined thickness, said second layer of material being comprised of at least one of a metal, a metal silicate, a metal oxide, a metal nitride, polysilicon, copper, aluminum, tantalum, silicon dioxide, silicon oxynitride and silicon nitride.

25. A method, comprising:
forming a plurality of features above a semiconducting substrate;
measuring at least one of a critical dimension and a profile of said plurality of features using a scatterometry tool;
determining a thickness of a layer of material to be conformally deposited around said plurality of features based upon said measured at least one of said critical dimension and said profile; and
conformally depositing said layer of material to said determined thickness around said plurality of features.

26. The method of claim 25, wherein forming a plurality of features above a semiconducting substrate comprises forming a plurality of line-type features above a semiconducting substrate.

27. The method of claim 25, wherein forming a plurality of features above a semiconducting substrate comprises forming a plurality of opening-type features above a semiconducting substrate.

28. The method of claim 25, wherein measuring at least one of a critical dimension and a profile of said plurality of features using a scatterometry tool comprises generating an optical characteristic trace for said plurality of features and comparing said generated optical characteristic trace to at least one optical characteristic trace stored in a library or created real-time, said stored optical characteristic or said real-time optical characteristic trace being representative of a plurality of features having at least one of a known critical dimension and a known profile.

29. The method of claim 25, further comprising:
measuring a combination of said deposited layer of material and said plurality of features using said scatterometry tool to measure a manufactured thickness of said layer of material;
determining a thickness of a second layer of material to be formed around a plurality of features formed above a subsequently processed substrate based upon said measured manufactured thickness of said layer of material; and
depositing said second layer of material to said determined thickness around said plurality of features formed above said subsequently processed substrate.

* * * * *